United States Patent [19]

Kahl

[11] Patent Number: 4,777,445
[45] Date of Patent: Oct. 11, 1988

[54] DEVICE FOR TESTING OF CABLES PROVIDED WITH PLUGS

[76] Inventor: Helmuth Kahl, Fossbrink 2, 4952 Porta Westfalica, Fed. Rep. of Germany

[21] Appl. No.: 828,162

[22] Filed: Feb. 10, 1986

[30] Foreign Application Priority Data

Feb. 11, 1985 [DE] Fed. Rep. of Germany ....... 3504606

[51] Int. Cl.⁴ ...................... G01R 31/04; G01R 1/073
[52] U.S. Cl. ................................. 324/538; 324/158 P; 324/158 F; 324/539
[58] Field of Search ............ 324/51, 66, 158 F, 158 P, 324/538, 539

[56] References Cited

U.S. PATENT DOCUMENTS 4,232,262 11/1980 Emo et al. ................... 324/158 P X

FOREIGN PATENT DOCUMENTS 3238949 5/1984 Fed. Rep. of Germany .

Primary Examiner—Gerard R. Strecker
Attorney, Agent, or Firm—Michael J. Striker

[57] ABSTRACT

A device for testing cables provided with plugs having plug contacts, as to connection failures, switching and the like, the device comprising a coupling element provided with a plug receptacle having a contour corresponding to that of a plug, a plurality of spring contacts extending through the coupling element and provided in a number and with an arrangement corresponding to those of the plug contacts, the spring contacts being provided with an electrical testing circuit, the spring contacts being arranged to contact the plug contacts after insertion of the plug under pressure, elements for fixing the plug which are actuatable after insertion of the plug and termination of a testing process, and a displacing member on which the spring contacts are mounted outside of the coupling element and by which the spring contacts are movable into the plug.

10 Claims, 3 Drawing Sheets

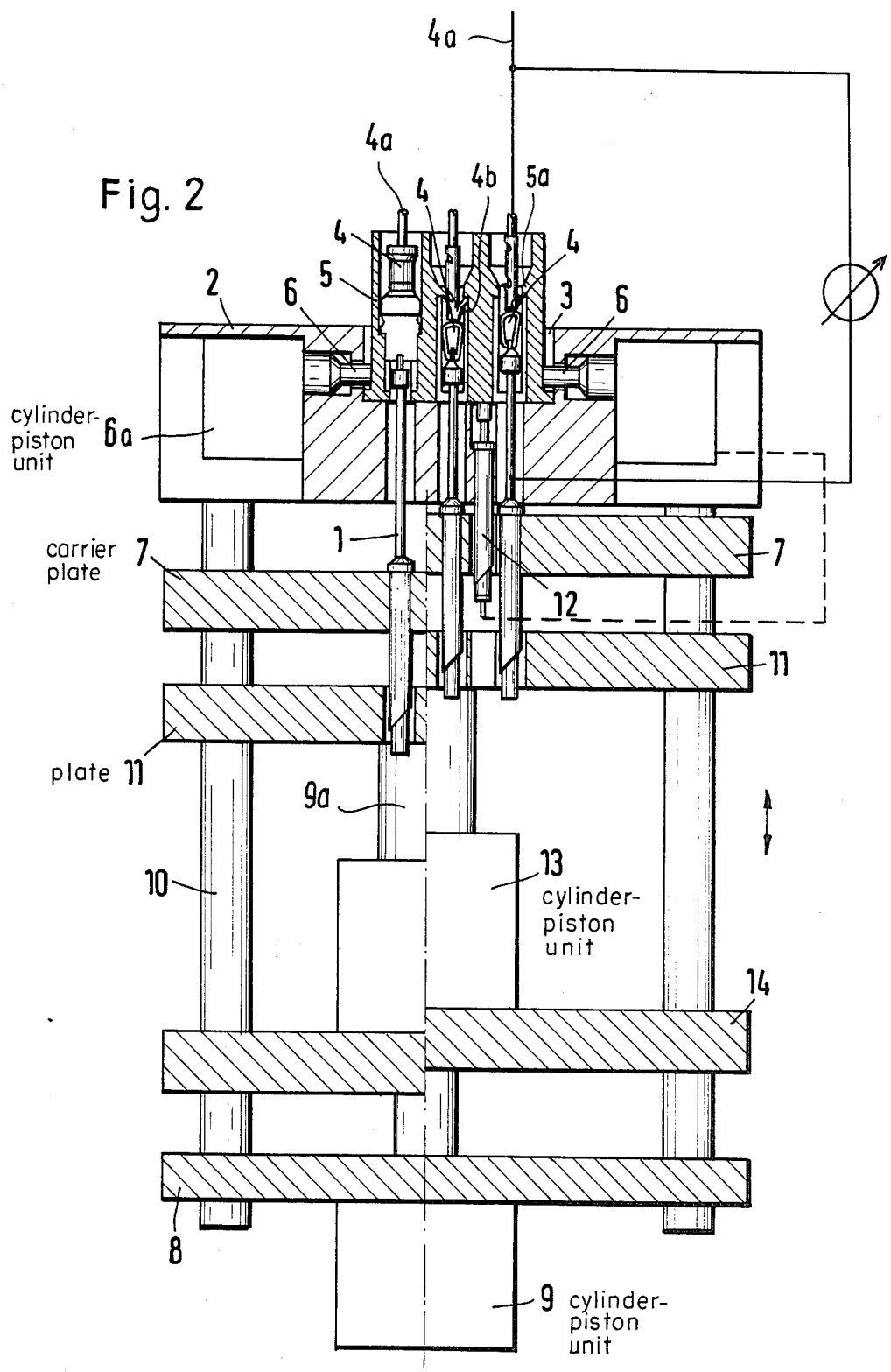

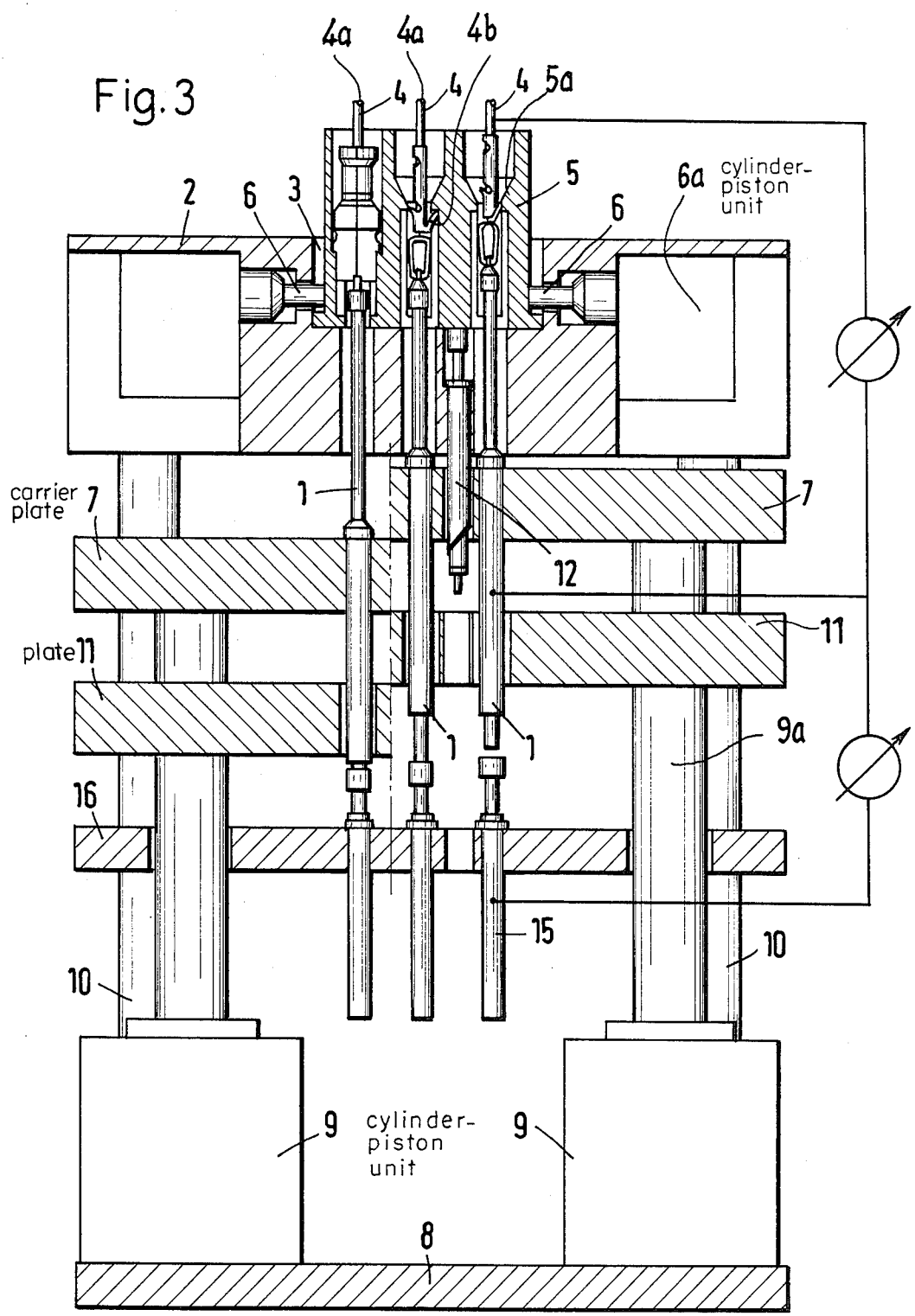

DEVICE FOR TESTING OF CABLES PROVIDED WITH PLUGS

BACKGROUND OF THE INVENTION

The present invention relates to a device for testing cables provided with plugs as to connection failure, switching and the like.

Devices of the above mentioned general type are known in the art. Known devices include coupling elements each of which have a plug or receptacle with the contour corresponding to a respective plug, spring contacts which extend through each coupling element and are provided in a number and with an arrangement corresponding to those of plug contacts, connected with an electric testing circuit, and contact the plug contacts after insertion of the plug under pressure, and means for fixing the plug which after insertion of the plug and termination of the testing step are pneumatically or electrical actuated.

Devices of the above mentioned general type are known in the art. For example, one of such devices is disclosed in DE-OS No. 3,238,949 A1. Here the spring contacts are fixed in the coupling element. During insertion of the plug in the coupling element, the movable parts of the spring contacts are compressed which requires a certain application of force. For facilitating the handling during insertion to the desired degree, the spring force of the respective spring contact must be maintained small especially when multi-pole plug with a plurality of plug contacts must be tested and therefore individual spring forces are added with one another.

This is disadvantaoeoussince it does not provide an unobjectionable possibilitV to recognize the connection failure or to test an orderly arresting between the plug conract and the plug. Especially during testing of cables or cable wirings for a power vehicle in which, because of high load and vibrations taking place during the travel, an increased strength requirement is applied to the arresting, testing failures can take place in the known devices in that the contacting ot the spring contact with the plug contact can take place which however does not bring spring force required for pressing the plug contact outwardly from a faulty arresting, so that a reliable testing is not guaranteed. An increase in the spring force which can eliminate this disadvantage is counteracted in accordance with the Applicant's invention.

SUMMARY OF THE INVENTION

Accordingly, it is an object of the present invention to provide a device for testing cables provided with plugs, which avoids the disadvantages of the prior art.

More particularly, it is an object to provide a device for testing cables with plugs which is designed so that the plug can be inserted into the coupling element without overcoming a spring force, and despite this problem-free arresting testing is guaranteed.

In keeping with these objects and with others which will become apparent hereinafter, one feature of the present invention resides, briefly stated, in that spring contacts are mounted outside a coupling element in a displacing member and are movable by the displacing member into the plug.

In accordance with the present invention, before the insertion of the plug into the coupling elements, the spring contacts are retracted with the aid of the displacing member, which advantageously can be formed as a carrier plate guided on guiding rods, so far from the region of the plug receptacle that the plug contacts do not contact the spring contacts after the insertion of the plug and the insertion can be performed without overcoming a spring force.

In a known manner, after the insertion of the plug a switch is actuated which in turn releases a locking mechanism for fixing the plug in the coupling element, which can be formed for example of one or several pneumatically actuated holding pins.

In correspondence with the objects of the invention, after locking of the plug the carrier plate moves in direction toward the plug, and simultaneously the spring contacts are pressed against the respective plug contacts and because of their spring force release the plug contacts from their arresting with the plug.

In the event of faulting arresting, the plug contact is released from the plug and this is determinable by an optical or manual testing.

In accordance with a further embodiment of the invention, the carrier plate after insertion of the spring contacts into the plug is partially retracted. This is especially advantageous for testing of a multi-pole plug, since the stroke during retraction of the carrier plate is smaller than the spring path of the spring contact and thereby the contact between the reliably arrested plug contacts and the spring contacts is maintained. In the event of a faulty arresting a plug contact which is pressed outwardly cannot assume automatically its initial position, so that a testing circuit can indicate for which plug contact an arresting failure takes place.

In accordance with a further especially advantageous feature of the present invention, the respective spring contacts are associated at their end facing away from the coupling element with springy contact pins which are connected with the testing circuit. The spring path of the contact pins is smaller than the spring pass of the spring contacts and the movement stroke of the carrier plate. They are held in advantageously one stationary plate and compressed in the initial position of the carrier plate by the spring contacts. In an advantageous embodiment of the spring contacts, their movable parts are formed of one piece.

During movement of the carrier plate in direction toward the plug and contacting of the respective spring contact with the plug contact, the problem-free contact of the spring contact with the contact spring pin is maintained with an effective arresting.

In the event of arresting failure, the respective spring contact is pressed into the plug so far that because of the smaller spring path of the contact pin, the contact with the spring contact is interrupted.

In this embodiment of the invention the spring path of the contact pin can be determined so that a nominal value is compared with an actual value and thereby in an advantageous manner an additional testing is performed, which makes possible high judgement via a respective displacement path of the spring contact.

After termination of the testing process, the carrier plate is retracted. The locking mechanism is released, and the plug pushed out by the short movement of the carrier plate.

Opposite to the known testing device, it is possible in the inventive device to adjust the spring force of each spring contact in an optimum manner to the requirements of testing of the arresting. This can be performed in accordance with an advantageous embodiment of the invention in that the spring force of each spring contact can be adjustable.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 2 is a view substantially corresponding to the view of FIG. 1, but showing another embodiment of the device in accordance with the present invention; and FIG. 3 is a view which substantially corresponds to the views of FIGS. 1 and 2, and shows a further embodiment of the device in accordance with the present invention.

DESCRIPTION OF PREFERRED EMBODIMENTS

Figure 1:
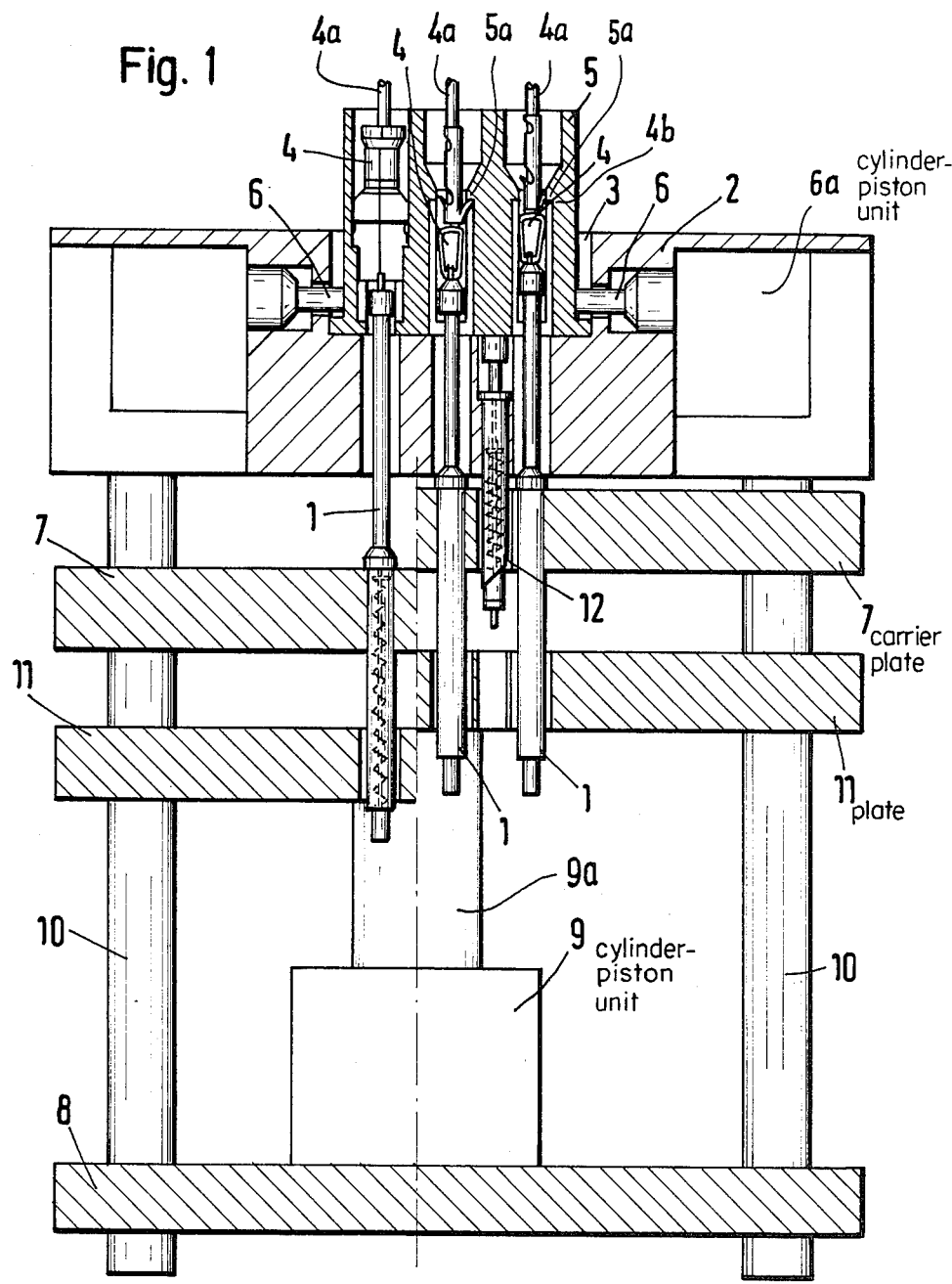
FIG. 1 is a view showing a longitudinal section of a device for testing cables, in accordance with one embodiment of the invention.

The device in accordance with the present invention is used for testing of cables, wherein a multi-pole cable with its contacts is arrested in a plastic plug body of a plug, so that the plug contacts and thereby the cables are mechanically reliably held in the plug 5. As can be seen from the drawings, the plug 5 has receiving openings in which projections 5a are provided. The cables 4a carry on their ends the contacts 4, and the contacts 4 have small rearwardly extending arresting projections 4b which engage behind the arresting projections 5a of the plug.

In the left part of FIGS. 1-3, which show the initial position or zero position of the testing, the contact 4 and the associated region of the plug 5 are offset by 90° relative to the central and right portion, so that the arresting projections 5a of the plug 5 and the arresting projections 4b of the contact 4 of the cable 4a cannot be seen.

Each of the devices for testing cables, shown in FIGS. 1-3, include basically a base plate 8, a coupling element 2 which is arranged parallel to the base plate 8, and a displacing member which is provided between the base plate 8 and the coupling element 2. The displacing member 7 is formed as a carrier plate 7 which is movable on guiding rods 10 which extend parallel to and at a distance from one another and connect the base plate 8 with the coupling elements 2. Several spring contacts 1 are mounted on the carrier plate 7 and extend through the coupling element 2.

The spring contacts 1 have one end which contacts with a respective associated plug contact 4 of the plug 5. The plug 5 is guided in a plug receptacle 3 of the coupling element 2 and is locked by means of two oppositely actuating pneumatically operated holding pins 6 which laterally adjust the plug 5. The number of the holding pins can vary.

A switching pin 12 is fixed parallel to the spring contacts 1 in the coupling element 2. During insertion of the plug 5 it is actuated by the plug and gives a command for locking the plug 5 by the holding pins 6. The number of the switching pins can also vary.

In the shown embodiments the plug 5 is multi-polar. It is provided at its free ends with a circumferential collar which engages behind the holding pins 6 during locking. It is also possible to test in accordance with the present invention a single-pole plug, in which event the number and the arrangement of the spring contacts 1 is respectively changed. If the plug without the circular collar and with smooth outer surface is tested, such holding pins are used whose head is formed in a known manner for example as a tip or has a structured surface.

As shown in FIGS. 1-3, the carrier plate 7 is arranged first in its initial position. In this position one spring contact 1 contacts one plug contact 4, however the spring contact 1 is not compressed by the plug contact 4. This takes place first during the following working step when the carrier plate 7 is moved forward by a pressure cylinder-piston unit 9 shown in FIG. 1 and an arrested plug contact 4 counteracts the spring pressure of a spring contact 1. The contact between the spring contact 1 and the plug contact 4 remains therefore maintained and is indicated by a not-shown testing circuit which is electrically connected with the spring contacts 1.

FIGS. 1-3 also show a faulty arresting. One plug contact 4 is pressed by a spring contact 1 outwardly beyond the plug 5. This can be determined in the embodiment of FIG. 1 by an optically or manual testing.

For supporting the spring contacts 1 which extend outwardly beyond the carrier plate 7 in direction toward the base plate 8, a guiding plate 11 is provided which receives the end of the spring contacts. The guiding plate 11 is connected with the carrier plate 7 at a distance from the carrier plate. The guiding plate 11 can be replaced by a ball bearing.

The testing in the device shown in FIG. 1 is performed in the following manner. The plug 5 with the contacts 4, 4b and thereby also the cable 4a is inserted into the respective receiving opening of the testing device. Thereby the switching pin 12 is actuated. The switching pin 12 is a conventional element which is well known in the art. For example, it is formed as a unit which has an outer sleeve, with a piston and a spring arranged in the sleeve, as well as a small switch. In the FIGS. 1-3, the piston is pressed-in to the contact position since the plug has been already inserted. By the pressing-in of the piston to the switching position, the smaller spring is compressed so that later on when the plug is removed, the piston is again extended. The same is true with respect to the spring contacts 1 which are conventional and have been known for a very long time. They operate on the same principle as described hereinabove. However, there is no switch in them. The spring contacts or pins 1 are composed of an outer sleeve and an inwardly arranged extendable and retractable pin, as well as a compressible spring in the sleeve. When the plug 5 is inserted and the piston of the switching pin 12 is compressed and actuates the respective contact, the drive unit which is identified with reference numeral 6a obtains an impulse and drives the pins 6 so as to hold the plug 5 in an arresting or "pushback-test" mode. The drive unit 6a can be of any construction, for example, pneumatic. The plug 5 is provided with a small collar or bead to engage with the holding pins 6. However, even without such collar or bead, the plug 5 is firmly held by the pins 6. The pins 6 in the latter mentioned case are pointed or provided with rough end surfaces, and for the required holding force several folding pins can be arranged around the plug. The switching impulse from the switch of the switching pin 12 can be supplied to the drive unit 6a in a wireless manner, so that no specific structure is shown in the drawings. A broken line schematically shows the respective connection.

When the plug is clamped, the upper ends of the pistons of the spring contact 1 abut against the lower ends of the plug contacts 4, as shown in FIGS. 1-3 at the left upper end. The sleeves of the spring contacts 1 are fixed in the carrier plate 7. The carrier plate 7 is moved upwardly by the pressure cylinder-piston unit 9. Naturally, the carrier plate 7 is mounted on the piston of the pressure cylinder-piston unit 9, for example, welded or screwed. When the carrier plate 7 is moved upwardly, the piston of the spring contact 1 cannot move upwardly first, since it is held back by the respective contact 4 in the plug 5.

When the embodiment of FIG. 1 the arresting 4b/5a is in order, the central position is obtained. If the arresting is not in order, the spring in the spring contact 1, as shown at the right side, presses the plug contact 4 together with the cable 4a out of the arresting upwardly. This can be determined in this simple verison just optically, in that the operator simply observes whether a respective cable 4a with its contacts 4 is pressed upwardly out of the plug 5.

An advantageous embodiment of the invention is shown in FIG. 2. In accordance with this embodiment, the device is provided with a pressing plate 14 which is displaceably fixed on the rods 10 between the guiding plate 11 and tne base plate 8. The pressing plate 14 is displaceable by a pressure cylinder-piston unit 9 which is mounted on the base plate 8, on the one hand. A further pressure cylinder-piston unit 13 is connected with the carrier plate 7 and mounted on the pressing plate 14, on the other hand. During forward displacement of the carrier plate 7 both the pressure cylinder-piston unit 9 and the pressure cylinder-piston unit i3 are actuated, so that the pressing plate 14 is moved over the stroke given by the pressure cylinder-piston unit 9. The forward stroke of the carrier plate 7 is obtained from the addition of the respective strokes of the pressure cylinder-piston units 9 and 13.

After the forward movement of the pressing plate 14 and the carrier plate 7, the pressing plate 14 and the carrier plate 7 which is connected with the pressing plate via the pressure cylinder-piston unit 13 are pulled by the pressure cylinder-piston unit 9 over its forward stroke, so that the return stroke of the carrier plate 7 is smaller than its forward stroke. The return stroke is similarly smaller than the spring displacement path of the spring contacts 1. This leads to the fact that with the orderly arresting of the plug contact 4 in the plug 5, the contact between the spring contact 1 and the plug contact 4 remains maintained, whereas in the event of arresting failure of the plug contact 4 in the plug 5 it is pressed out from the plug during forward movement of a carrier plate 7 so far from the spring contact 1 that after the return of the carrier plate 7 the contact between the spring contact 1 and the plug contact 4 is interrupted and indicated by the testing circuit.

The testing circuit can be formed as a very simple electrical measuring device which is activated by the above-described interruption of the contact between the spring contact 1 and the plug contact 2, similarly to a conventional contact interruption, when no current flows therethrough in the event of contact interruption. The absence of the current flow can be determined in any conventional manner, for example, optically by extinguishing of a small bulb, or digitally on an image screen, etc.

In a further especially advantageous embodiment of the invention shown in FIG. 3, a plate 16 is fixed between the base plate 8 and the guiding plate 11 on the guiding rods 10. Springy expandable-compressible contact pins 15 extend in the axial direction of the spring contacts 1 and are stationarily mounted in the plate 16. Their number and arrangement correspond to the number and the arrangement of the spring contacts 1.

The contact pins 15 are arranged at such a distance from the spring contacts 1 that in the initial position of the carrier plate 7 they are compressed by the spring contacts 1. During forward movement of the carrier plate 7 with a problem-free arresting of the plug contact 4 in the plug 5, the contact between the respective expanding contact pin 15 and the spring contact 1 remains maintained.

Since the spring displacement path of the spring contact 1 is greater than that of the contact pin 15, in the event of an arresting failure of the plug contact 4 in the plug 5 the spring contact i is displaced into the plug 5 so far that the contact between the contact pin 15 and the spring contact 1 is interrupted. It is important that the spring displacement path of the spring contact 15 is smaller than the displacement stroke of the carrier plate 7.

FIG. 3 is a further improvement for the following reason. In the embodiment of FIG. 2 it is possible theoretically that the pressed-out faulty arrested contact 4 together with the cable 4 falls back again and the contact is produced, which in practice of course is a very seldom situation. In the embodiment of FIG. 2 an electrical measurement would show that there is no current. This feature theoretically can be obtained not only by a faulty arresting produced during testing and thereby the contact is interrupted, but it can result from a failure in the cable 4a itself on the path between the end of the associated contact 4 and the engaging point of the measuring circuit on the cable 4a. In each of these two situations the faulty arresting will be indicated without differentiating its cause.

In the embodiment of FIG. 3 an air gap is processed, however, in accordance with a different verison. In this embodiment the air gap is formed not between the contact 4 and the piston of the spring contact 1 which directly acts on it, but instead between both spring contacts 1 and 15 in the event of a faulty arresting. Two measuring circuits are provided in the embodiment of FIG. 3. When there is no current in the lower measuring circuit between both spring pins 1, 15, this is an indication of a faulty arresting in every case, and nothing else can take place. When there is no current in the upper measuring circuit, there is an interruptional failure in the cable itself. Thus, a differentiated failure diagnosis can be obtained here.

The above described embodiments are only exemplary. Many embodiments of the device of the present invention are possible. For example, it is possible in connection with different displacement possibility of the carrier plate 7 shown in FIG. 2, to provide instead of two separately actuating pressure cylinder-piston units 9 and 13, one pressure cylinder-piston unit whose different displacement strokes can be controlled by respective end switches.

It is also possible to provide an additional testing by a measurement of the spring path of the contact pins 15 shown in FIG. 3, in accordance with which a predetermined nominal stroke is compared with an actual stroke by the testing circuitry or a special switch. This nominal-actual measurement can also be performed by a measurement of the change in induction or resistance value.

A further embodiment of the invention is possible, in which the spring force of the spring contact 1 is adjustable so that differently loadable arrestings can be tested with the same spring contacts 1.

It will be understood that each of the elements described above, or two or more together, may also find a useful application in other types of constructions differing from the types described above.

While the invention has been illustrated and described as embodied in an arrangement for testing cables with plugs, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A device for testing cables provided with plugs having plug contacts, as to failures of plug contacts to be arrested in a certain position in a plug, the device comprising a coupling element provided with a plug receptacle for insertion of a plug and having a contour corresponding to that of the plug; means for fixing the plug in said coupling element after insertion of the plug; a plurality of spring contacts, each comprising a spring biased pin movable over a predetermined spring displacement path and extending through said coupling element to obtain access to said plug, said spring contacts provided in a number and with an arrangement corresponding to those of the plug contacts; a displacing member on which said spring contacts are mounted outside of said coupling element; means for moving said displacing member a predetermined distance toward said coupling element so as to move the pins of said spring contacts into the plug so that said spring contacts establish a contact with the plug contact through said pins under pressure and at the same time such one of the plug contacts which has an arresting failure is pushed out from the plug; means for moving said displacing element away from said coupling element a shorter distance than said predetermined spring displacement path and said predetermined distance moved by said displacement member so that upon movement away of said shorter distance, the contact of said spring contacts with those of the plug contacts which are properly arrested in the plug is maintained, while the contact of at least one of said spring contacts with the one plug contact which has an arresting failure in the plug is interrupted so that a gap is formed therebetween; and electrical means operative for detecting said gap between said at least one spring contact and the one plug contact and thereby indicating the arresting failure of the one plug contact.

2. A device as defined in claim 1, wherein said means for fixing the plug is formed as pneumatically operated means.

3. A device as defined in claim 1, wherein said means for fixing the plug is formed as electrically operated means.

4. A device as defined in claim 1; and further comprising a plurality of guiding rods, said displacing member being formed as a carrier plate which is arranged displaceably on said guiding rods.

5. A device as defined in claim 1, wherein said spring pins are formed so that their spring force is adjustable.

6. A device as defined in claim 4; and further comprising a guiding plate which is connected with said carrier plate and arranged parallel and at a distance from said carrier plate, said spring contacts having free ends which are guided in said guiding plate.

7. A device as defined in claim 4; and further comprising a plate which is connected with said carrier plate and arranged displaceably on said guiding rods, so that said spring contacts are movable by said plate and said carrier plate.

8. A device as defined in claim 4; and further comprising a pressure cylinder-piston unit which is arranged to displace said carrier plate and thereby said spring contacts.

9. A device as defined in claim 1; and further comprising an end switch actuatable by insertion of the plug and acting upon said fixing means to fix the plug after insertion.

10. A device for testing cables provided with plugs having plug contacts, as to failures of plug contacts to be arrested in a certain position in a plug, the device comprising a coupling element provided with a plug receptacle for insertion of a plug and having a contour corresponding to that of the plug; means for fixing the plug in said coupling element after insertion of the plug; a plurality of movable spring contacts, each having a first end which extends through said coupling element to obtain access to said plug and provided in a number and with an arrangement corresponding to those of the plug contacts, said spring contacts each having a second end which faces away from said coupling element; a plurality of spring biased contact pins which are associated with said second end of each of said spring contacts in confronting relationship therewith and mounted stationarily and expandable in direction toward said spring contacts, each of said contact pins having a spring displacement path which is smaller than that of said spring contacts and being compressed by said spring contacts; and a displacing member on which said spring contacts are mounted outside of said coupling element, said displacing member being movable from an initial position in which said contact pins are compressed by said spring contacts and to another position toward said coupling element so as to move said spring contacts into the plug so that said spring contacts establish a contact under pressure with those of the plug contact which are properly arrested in the plug and remain stationarily, while at least one of said spring contacts associated with one plug contact which has an arresting failure and pushed out from the plug moves further so that a contact between said end of said at least one spring contact and an associated one of said contact pins is interrupted and a gap is formed therebetween; and electrical means operative for detecting said gap between said end of said at least one spring contact and said associated contact pin and thereby indicating the arresting failure of the one plug contact.

* * * * *